(12) United States Patent
Rowell et al.

(10) Patent No.: US 10,996,252 B2
(45) Date of Patent: May 4, 2021

(54) MEASUREMENT ARRANGEMENT AND MEASUREMENT METHOD

(71) Applicant: Rohde & Schwarz GmbH & Co. KG, Munich (DE)

(72) Inventors: Corbett Rowell, Munich (DE); Vincent Abadie, Hohenschäftlarn (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 53 days.

(21) Appl. No.: 16/203,067

(22) Filed: Nov. 28, 2018

(65) Prior Publication Data

US 2019/0361060 A1    Nov. 28, 2019

(30) Foreign Application Priority Data

May 25, 2018   (EP) ..................... 18174219

(51) Int. Cl.

| H01Q 1/24 | (2006.01) |
|---|---|
| G01R 29/08 | (2006.01) |
| G01R 19/25 | (2006.01) |
| G02B 27/09 | (2006.01) |

(52) U.S. Cl.
CPC ..... *G01R 29/0878* (2013.01); *G01R 19/2506* (2013.01); *G02B 27/0977* (2013.01); *H01Q 1/24* (2013.01)

(58) Field of Classification Search
CPC ...... H01Q 1/24; H01Q 1/225; G01R 29/0878; G01R 19/2506; G01R 29/0814; G01R 27/0977; G02B 27/0977; H04B 17/101; H04B 17/102; H04B 17/103
See application file for complete search history.

(56) References Cited

U.S. PATENT DOCUMENTS

| 5,706,017 A * | 1/1998 | Buttgenbach .......... H01Q 19/06 343/753 |
|---|---|---|
| 2008/0156991 A1 | 7/2008 | Hu et al. |
| 2015/0357713 A1 | 12/2015 | Griffith et al. |
| 2017/0115334 A1 * | 4/2017 | Symes ..................... H01Q 1/24 |
| 2018/0006745 A1 | 1/2018 | Vanwiggeren |
| 2019/0285678 A1 * | 9/2019 | Abadie ................ H04B 17/309 |

FOREIGN PATENT DOCUMENTS

| EP | 2443699 A1 | 4/2012 |
|---|---|---|
| WO | 2018/093858 A1 | 5/2018 |

OTHER PUBLICATIONS

Extended Search Report from counterpart European Application No. 18174219.8, dated Nov. 9, 2018, 8 pp.

* cited by examiner

*Primary Examiner* — Dimary S Lopez Cruz
*Assistant Examiner* — Michael M Bouizza
(74) *Attorney, Agent, or Firm* — Shumaker & Sieffert, P.A.

(57) ABSTRACT

The present invention relates to a measurement of radio-frequency signals by a measurement arrangement comprising a radio-frequency lens for mapping a vertex of a reflector to a virtual vertex. Accordingly, measurement of radio-frequency signals may be performed either at the vertex of the reflector or the virtual vertex generated by means of the radio-frequency lens.

13 Claims, 2 Drawing Sheets

MEASUREMENT ARRANGEMENT AND MEASUREMENT METHOD

TECHNICAL FIELD

The present invention relates to a measurement arrangement. The present invention further relates to a measurement method.

TECHNICAL BACKGROUND

Although applicable in principal to any wireless measurement arrangement, the present invention and its underlying problem will be hereinafter described in combination with testing of wireless communication devices.

The use of wireless communication systems for communication between electronic device increases continually with the advance of high-speed wireless data communications.

During development or production of devices for such communication systems it is necessary to thoroughly test the devices for compliance with communication standards and legal regulations.

For this purpose, testing wireless communication devices may comprise analyzing the radio-frequency emissions of the wireless communication devices. In some cases, a communication device may not only emit wireless signals relating to one or more desired frequency or frequency range. Moreover, it may be possible that due to harmonics or any other reasons further unwanted radio-frequency emissions are emitted. Such unwanted radio-frequency emissions may be denoted as a spurious emissions. For example, spurious emissions are discussed in the recommendations for ITU-R SM.329-7.

For measuring spurious emissions when testing wireless devices, it might be desirable to perform a broadband measurement of spurious emissions and a narrow-band measurement of in-band signals of the wireless device.

SUMMARY OF THE INVENTION

Against this background, there is the need to provide a versatile and simple measurement of wireless devices.

The present invention solves this problem with a measurement arrangement and the measurement method with the features of the independent claims. Further embodiments are subject matter of the dependent claims.

According to a first aspect, a measurement arrangement for measuring radio-frequency signals is provided. The measurement arrangement comprises a reflector, a radio-frequency lens and a first antenna. The reflector is adapted to focus radio-frequency signals at a predetermined vertex of the reflector. The first antenna is adapted to receive radio-frequency signals and/or emit radio-frequency signals. In particular, the first antenna is arranged outside the vertex of the reflector. The radio-frequency lens is arranged between the vertex of the reflector and the first antenna, in particular a phase center of the first antenna.

According to a second aspect, a measurement method for measurement radio-frequency signals is provided. The measurement method comprises a step of receiving a radio-frequency signals by a first antenna and/or emitting radio-frequency signals by the first antenna. The first antenna is arranged outside a vertex of a reflector, wherein the reflector focuses radio-frequency signals at the vertex. Furthermore, a radio-frequency lens is arranged between the vertex of the reflector and the first antenna, in particular a phase center of the first antenna.

The present invention is based on the fact that measuring radio-frequency signals, in particular measuring radio-frequency signals for testing a wireless device, may require both, measuring in-band signals relating to a narrow frequency band and measuring further signals, e.g. spurious emissions or the like, relating to a broad frequency range. Thus, different types of antenna may be used for measuring signals relating to a narrow frequency band, and signals relating to a broad frequency range.

However, when measuring radio-frequency signals by a number of more than one antenna, the individual antennas have to be located at different spatial locations. Alternatively, different antennas may be subsequently arranged at a same spatial location for measuring the radio-frequency signals. Such a modification in the measurement arrangement requires a complex system for moving around all the antennas.

Thus, it is an idea of the present invention to provide a measurement arrangement which enables a measurement of radio-frequency signals, in particular radio-frequency signals at a predetermined vertex of a reflector, wherein the individual antennas may be located at different spatial positions. In particular, it is an idea of the present invention to use an additional radio-frequency lens in the measurement arrangement. Such a radio-frequency lens may map a vertex of the reflector to a virtual vertex at a different spatial position.

Hence, an additional antenna may be arranged at the respective virtual vertex provided by the radio-frequency lens.

The reflector may be any kind of reflector which is appropriate for reflecting radio-frequency signals. For example, the reflector may have a parabolic or a cylindrical shape. However, any other shape of the reflector for focusing the radio-frequency waves at a predetermined vertex may be also possible. The vertex may be located, for example in a center of the reflector or at a position outside the center of the reflector.

The radio-frequency lens may be a device which is appropriate for reflecting the electromagnetic waves of the radio-frequency signal. In particular, the radio-frequency lens may have a predetermined focus. Thus, the distance between the vertex of the reflector and the radio-frequency lens as well as the distance between the radio-frequency lens and the antenna, in particular the phase center of the antenna may be set up depending on the focus of the radio-frequency lens.

The radio-frequency lens may comprise any appropriate material for reflecting radio-frequency waves. Furthermore, the dimensions and the shape of the radio-frequency lens may be adapted to the desired properties of the measurement arrangement.

The first antenna may be any type of antenna that is adequate for performing the required measurements. In particular, the bandwidth of the antenna may be adapted depending on the desired measurement requirements. For example, an antenna having a narrow bandwidth of only a few kilohertz (kHz) or mega-hertz (MHz) may be selected for measuring in-band signals. Alternatively, an antenna having a broad bandwidth of many kilohertz, megahertz or even gigahertz may be selected for measuring broadband signals like spurious emissions. Accordingly, the type of the antenna may be selected depending on the desired measurement requirements. The antenna may further comprise a connector for connecting a measurement cable or a direct connection to a measurement device.

With the above described measurement arrangement, the antenna, in particular the phase center of the antenna may be located at a spatial position outside the vertex of the reflector. By means of the radio-frequency lens, the vertex of the reflector can be mapped to a virtual vertex, in particular a virtual vertex at the phase center of the antenna. Thus, the antenna may measure the radio-frequency signals focused by the reflector even though the antenna is at a spatial position outside the vertex of the reflector.

Further embodiments of the present invention are subject of the further subclaims and of the following description, referring to the drawings.

In a possible embodiment, the radio-frequency lens is adapted to over-focus a beam of the first antenna. In particular, a phase center of the first antenna may be over-focused to the vertex of the reflector. In this way, a virtual vertex of the reflector is created.

The distance between the vertex of the reflector and the virtual focus created by means of the radio-frequency lens may depend on the focus of the radio-frequency lens. In this way, the vertex of the reflector may be shifted to another spatial position and thus, the antenna may be located at a spatial position outside the vertex of the reflector. Hence, the vertex of the reflector is still available, for example for further measurements by an additional radio-frequency sensor.

In a possible embodiment, the first antenna is mounted at a fixed position with respect to the reflector. Furthermore, the radio-frequency lens may be also mounted at a fixed position.

In particular, the first antenna may be located at the virtual vertex created by the radio-frequency lens. Accordingly, the radio-frequency lens and the first antenna may be mounted at fixed positions by means of a simple mounting structure. Such a fixed mounting structure can be easily realized with low manufacturing costs. Nevertheless, the vertex of the reflector is still available for further measurement purposes.

In an alternative embodiment, the measurement arrangement further comprises a mechanical positioning structure. The mechanical positioning structure may be adapted to carry the first antenna. Furthermore, the mechanical positioning structure may move around the first antenna.

In this way, it is possible to move the first antenna away from the virtual vertex. Thus, it may be even possible to replace the first antenna by another antenna for further measurement purposes.

In a possible embodiment, the mechanical positioning structure may be adapted to move the first antenna to the vertex of the reflector. By moving the antenna to the spatial position of the vertex of the reflector, an alternative measurement may be performed without any influence of the radio-frequency lens. Hence, the flexibility of the measurement may be enhanced.

In a possible embodiment, the reflector may be a reflector of a compact antenna test range (CATR).

CATR are well-known antenna structures comprising a reflector. Thus, by combining a CATR structure with the additional radio-frequency lens for generating a virtual vertex of the reflector, a very flexible measurement arrangement can be achieved.

In a possible embodiment, the measurement arrangement further comprises a second antenna and a movable antenna carrier. The movable antenna carrier may be adapted to carry the second antenna and to move around the second antenna. In particular, the second antenna may be moved to a first position such that the second antenna is located at the vertex of the reflector. Alternatively, the second antenna may be moved to a second position such that the second antenna is located outside the vertex of the reflector.

Accordingly, upon moving the second antenna to the vertex of the reflector, a measurement of radio-frequency signals may be performed by the second antenna. Such a measurement by means of the second antenna can be performed even though it is not necessary to move around the first antenna and the radio-frequency lens. Furthermore, by simply removing the second antenna from the vertex of the reflector, the radio-frequency measurement may be performed by the first antenna. In this way, a very simple configuration for alternatively measuring radio-frequency signals either by the first or by the second antenna can be achieved.

The movable antenna carrier and/or the mechanical positioning structure may e.g. comprise a guide or rail and a slide that carries the respective antenna. The movable test antenna carrier and/or the mechanical positioning structure may also comprise a slide with wheels or simply be a mechanical holding device that is not fixed to the ground and may therefore be carried into the required position.

In a possible embodiment, the first antenna and/or the second antenna may comprise a horn antenna. Horn antennas are very appropriate antennas for measuring radio-frequency signals at a predetermined phase center. However, it is understood that any other kind of antenna, for example micro strip antennas or any other kind of antenna may be also used for measuring radio-frequency signals.

In a possible embodiment, either the first antenna or the second antenna may comprise a wideband antenna.

Furthermore, the other antenna of the first and the second antenna may comprise a narrowband antenna. In this way, a configuration for measuring broadband signals and narrowband signals by means of a common measurement arrangement can be achieved.

In a possible embodiment, a bandwidth of the first antenna is different from a bandwidth of the second antenna.

As already mentioned above, one of the antennas may be an antenna of a broad bandwidth and the other antenna may be an antenna of a narrow bandwidth. However, the first and the second antenna may also be different with respect to any other radio-frequency property. For example, the first antenna and the second antenna may be adapted to perform measurement at different frequency ranges. In this way, multiple frequency ranges may be covered by the measurement arrangement.

In a possible embodiment, the measurement arrangement may comprise a measurement processor. The measurement processor may be coupled to the first antenna and the second antenna. Furthermore, the measurement processor may be adapted to perform a first measurement upon the second antenna is moved to the first position, and the measurement processor may perform a second measurement upon the second antenna is moved to the second position.

In particular, the measurement processor may perform a measurement based on the signals provided by the second antenna if the second antenna is located at the vertex of the reflector. Alternatively, the measurement processor may perform a measurement based on the radio-frequency signals related to the first antenna, if the second antenna is located outside the vertex of the reflector, and thus, the radio-frequency signals are measured at the virtual vertex by means of the first antenna. Accordingly, the measurement processor may perform measurements based on radio-frequency signals provided by different measurement antennas.

The measurement processor may e.g. comprise a general purpose processor with corresponding instructions. Further, the measurement processor may comprise interfacing elements that are coupled to the processor, receive the measured signals from the antennas and provide the received signals to the processor. Such interfacing elements may e.g. comprise analog to digital converters that convert the received signals into digital data that may be processed by the processor. Such dedicated analog to digital converters may e.g. be coupled to the processor via a serial or a parallel digital interface. Between the digital to analog converters and an input port analog elements, like e.g. filters comprising resistors, capacitors and inductors, or the like may be provided.

It is understood, that a dedicated measurement device may also be provided in a possible implementation. The dedicated measurement device may be coupled to the antennas and may e.g. be a vector network analyzer, an oscilloscope or the like.

In a possible embodiment, the measurement arrangement may comprise a measurement chamber that may accommodate the first antenna, the second and the device under test.

The measurement chamber may comprise a shielding or protective housing that isolates the test arrangement from any outside interference or disturbance during the measurements. It is understood that the measurement chamber may e.g. also comprise a door or sealable opening for accessing the insides of the measurement chamber, e.g. to place the device under test in the measurement chamber.

In a possible embodiment, the measurement chamber may comprise an anechoic chamber.

An anechoic chamber is a measurement chamber that is designed to completely absorb reflections of electromagnetic waves.

The interior surfaces of the anechoic chamber may be covered with radiation absorbent material, RAM. RAM is designed and shaped to absorb incident RF radiation as effectively as possible. Measurements in electromagnetic compatibility and antenna radiation patterns require that signals arising from the test setup, like e.g. reflections, are negligible to avoid the risk of causing measurement errors and ambiguities.

With the anechoic chamber the quality of the measurements performed with the test arrangement may therefore be increased.

Especially for smaller devices like e.g. mobile phones or IoT devices, a small anechoic chamber may be sufficient to perform conformance tests because the radiating surface may be relatively small.

With the present invention it is therefore now possible perform a measurement of spurious emissions of the device under test, for example a wireless communication device like a mobile phone, a base station, and Internet of things (IoT) device or any other wireless device. In particular, it is possible to measure the spurious emissions relating to a number of frequencies. Since at least one of the antennas may be located outside a vertex of the reflector, a number of more than one antenna may be used for measuring in-band-signals and spurious emissions. Thus, the individual antennas may be adapted to the respective measurement requirements.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
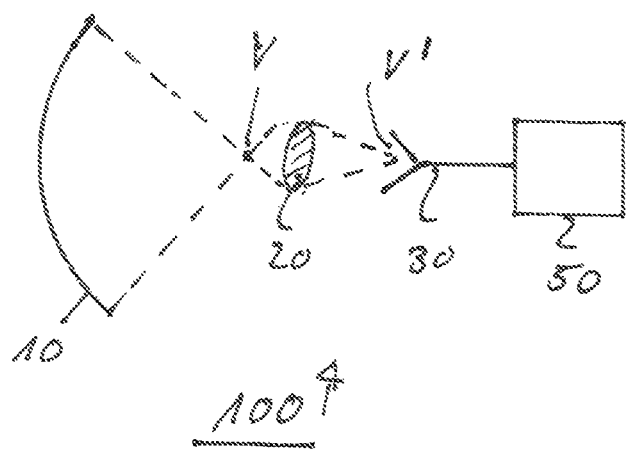
FIG. 1 shows a block diagram of an embodiment of a measurement arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a measurement arrangement 100 according to an embodiment. The measurement arrangement comprises a reflector 10, a radio-frequency lens 20 and a first antenna 30. Furthermore, the measurement arrangement may comprise a measurement processor 50.

The reflector 10 of the measurement arrangement 100 may be any kind of appropriate reflector for focusing radio-frequency signals at a predetermined vertex V. For example, the reflector may have a spherical or parabolic shape. The vertex V of the reflector may be located on a main axis of the reflector 10. In particular, the vertex V of the reflector 10 may be located in a center of the reflector 10. However, it may be also possible that the vertex V is located at an off-set position, in particular an off-set position with respect to the center of the reflector 10. Accordingly, parallel radio-frequency waves may be focused by the reflector 10 at the vertex V.

The antenna 30 may be located outside the vertex V of the reflector 10. For example, the antenna 30 may be a horn antenna. However, any other appropriate antenna for receiving and/or emitting radio-frequency signals may be also possible. A terminal of the antenna 30 may be connected with measurement process 50. Accordingly, the radio-frequency signals received by the first antenna 30 may be provided to the measurement processor 50. Additionally or alternatively, radio-frequency signals generated by the measurement processor 50 may be emitted by the first antenna 30.

The radio-frequency lens 20 may be spatially located between the vertex V and the first antenna 30. In particular, the arrangement of the reflector 10, the radio-frequency lens 20 and the first antenna 30 may be arranged such that the vertex V of the reflector 10 is mapped to a virtual vortex V' at the phase center of the first antenna 30. In other words, the vertex V of the reflector 10 is over-focused to the phase center of the first antenna 30. In this way, the first antenna 30 may measure the radio-frequency signals even though the first antenna 30 is spatially located outside the vertex V of the reflector 10. Hence, the spatial position of the vertex V of the reflector 10 is still available, for example for further measurements by means of another device.

Figure 2:
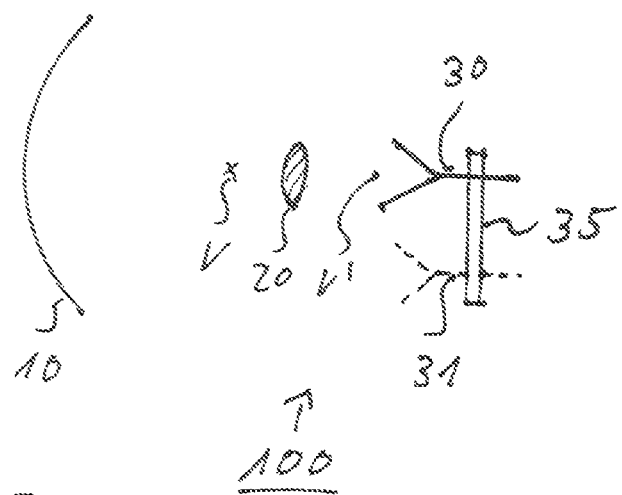
FIG. 2 shows a block diagram of another embodiment of a measurement arrangement according to the present invention.

FIG. 2 shows a block diagram of a measurement arrangement 100 according to a further embodiment. The embodiment of FIG. 2 mainly corresponds to the previous embodiment with respect to FIG. 1. Thus, the respective explanation regarding the FIG. 1 is still valid for this embodiment.

The embodiment of FIG. 2 differs from the previous embodiment in that the measurement arrangement according to FIG. 2 further comprises a mechanical positioning structure 35. The mechanical positioning structure 35 may carry the first antenna 30. Accordingly, the first antenna 30 may be moved around by means of the mechanical positioning structure 35. In particular, the first antenna 30 may be moved away from the virtual vertex V'. For example, the first antenna 30 may be moved to the vertex V of the reflector 10. Accordingly, it may be possible to compare the measurements at the virtual vertex V' with the measurements at the vertex V.

Furthermore, it may be also possible that a number of one or more further antennas 31 may be arranged at the mechanical positioning structure 35. In this case, the mechanical positioning structure 35 may alternatively move one of the multiple antennas 30, 31 to the virtual vertex V'. Thus, it may be possible to perform measurements by means of different antennas 30, 31 at the position of the virtual vertex V'.

Figure 3:
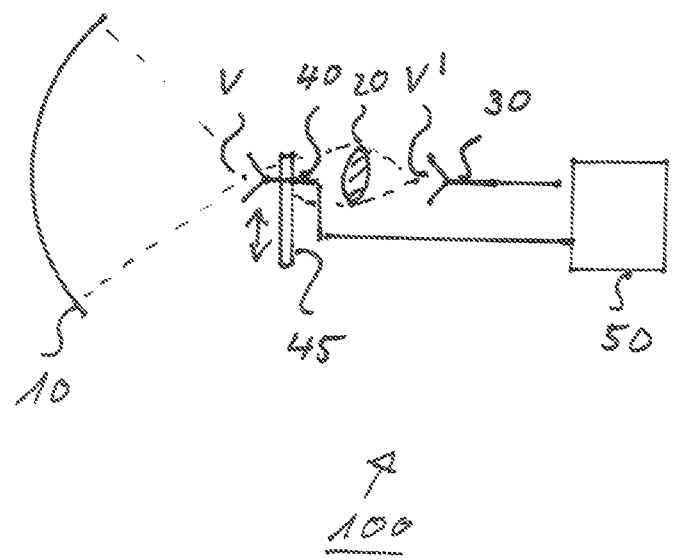
FIG. 3 shows a block diagram of still another embodiment of a measurement arrangement according to the present invention and FIG. 4 shows a flow diagram of an embodiment of a measurement method according to the present invention.

FIG. 3 shows a further embodiment of a measurement arrangement 100. The measurement arrangement 100 of FIG. 3 mainly corresponds to the previously described measurement arrangement. Thus, the description regarding to the previous embodiments also applies to the embodiment of FIG. 3.

The embodiment of FIG. 3 differs from the previously described embodiments in that a further, second antenna may be located at the vertex V of the reflector 10. For example, the second antenna 40 may be arranged on a movable antenna carrier 45. The movable antenna carrier 45 may either move the second antenna 40 to the vertex V of the reflector 10, or move the second antenna 40 to a position outside the vertex V. Thus, if the second antenna 40 is located at the vertex V of the reflector 10, the second antenna 40 may receive the radio-frequency signals at the vertex V of the reflector 10, or radio-frequency signals may be emitted by the second antenna 40.

Alternatively, if the second antenna 40 is moved to a position outside the vertex V, the radio-frequency signals may be measured by means of the first antenna 30 at the position of the virtual vertex V'. In this way, it is possible to perform measurements by means of two different antennas, namely the first antenna 30 or the second antenna 40.

Accordingly, different types of antenna may be used for performing the measurements. For example, one of the first antenna 30 or the second antenna 40 may be a broadband antenna and the other antenna may be an antenna having a narrow band-width. Furthermore, one or more of the characteristic properties of the antennas may be also different for the first antenna 30 and the second antenna 40. For example, the antennas may be adapted to receive radio-frequency signals relating to different frequency ranges, in particular frequency ranges which do not overlap or may only partially overlap. It is understood that any other property of the first antenna 30 and the second antenna 40 may be also adapted for appropriate measurement purposes.

For example, the first antenna 30 may be a broadband antenna. Such a broadband antenna may be used, for example for measuring spurious emissions of a device under test. Since spurious emissions may relate to a relative broad frequency range, the respective antenna may be configured accordingly. Furthermore, the second antenna 40 may be configured for receiving and/or emitting in-band signals of a device under test. Accordingly, for this purpose, the second antenna 40 may be adapted to a relative narrow frequency range relating to the in-band signals. Thus, the in-band signals may be received/emitted with a higher efficiency due to the relative small bandwidth of the second antenna 40.

Accordingly, broadband measurements, for example for measuring spurious emissions, may be performed by moving the second antenna outside the vertex V of the reflector 10. Furthermore, for measuring in-band signals, the second antenna 40 may be moved to the vertex V of the reflector 10. However, it is understood that it may also possible to use a broadband antenna as the second antenna 40 and an antenna having a small bandwidth for in-band communication as the first antenna 30.

The measurement arrangement, in particular the reflector 10, the first antenna 30 and the radio-frequency lens 20, and if necessary the second antenna 40 may be arranged in a measurement chamber, in particular an anechoic chamber.

For sake of clarity in the following description of the method based on FIG. 4, reference signs used above in the description of the measurement arrangement 100 based on FIGS. 1 to 3 will be maintained.

Figure 4:
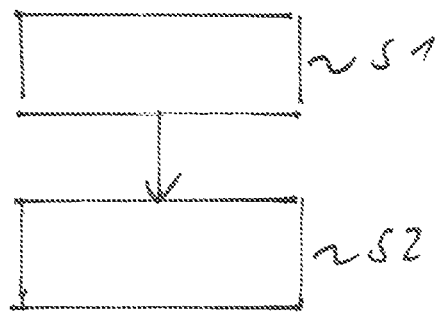

FIG. 4 shows a flow diagram of a test method for measuring radio-frequency signals. The measurement method comprises a step S1 of receiving a radio-frequency signal by a first antenna 30 and/or emitting a radio-frequency signal by the first antenna 30. In particular, the first antenna 30 may be arranged outside a vertex V of a reflector 10, wherein the reflector 10 focuses radio-frequency signals at the vertex V. Furthermore, a radio-frequency lens 20 may be arranged between the vertex V of the reflector 10 and the first antenna, in particular a phase center of the first antenna 30.

Furthermore, a second antenna 40 may be used for alternatively measuring radio-frequency signals either by the first antenna 30 or the second antenna 40. In this case, for performing step S1 the second antenna 40 may be moved outside the vertex V of the reflector 10 for performing a first measurement. In a step S2 the second antenna 40 may be moved to the vertex V of the reflector 10 for performing the second measurement.

Summarizing, the present invention relates to a measurement of radio-frequency signals by a measurement arrangement comprising a radio-frequency lens for mapping a vertex of a reflector to a virtual vertex. Accordingly, measurement of radio-frequency signals may be performed either at the vertex of the reflector or the virtual vertex generated by means of the radio-frequency lens.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention.

However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100 measurement arrangement
10 reflector
20 radio-frequency lens
30, 31 first antenna
35 mechanical positioning structure
40 second antenna
45 moveable antenna carrier
50 measurement processor
V vertex of reflector
V' vertex vertex

What we claim is:

1. A measurement arrangement for measuring radio-frequency signals, the measurement arrangement comprising:
   a reflector adapted to focus radio-frequency signals at a predetermined vertex of the reflector;
   a first antenna adapted to receive radio-frequency signals and/or emit radio-frequency signals, the first antenna being arranged outside the vertex of the reflector;
   a radio-frequency lens arranged between the vertex of the reflector and the first antenna;
   a second antenna for measuring radio frequency signals; and
   a movable antenna carrier adapted to carry the second antenna and to move the second antenna to a first position such that the second antenna is located at the vertex of the reflector or to a second position such that the second antenna is located outside the vertex of the reflector.

2. The measurement arrangement of claim 1, wherein the radio-frequency lens is adapted to over-focus a beam of the first antenna to the vertex of the reflector.

3. The measurement arrangement of claim 1, wherein the first antenna is mounted at a fixed position with respect to the reflector.

4. The measurement arrangement of claim 1, further comprising a mechanical positioning structure adapted to carry the first antenna and to move around the first antenna.

5. The measurement arrangement of claim 4, wherein the mechanical positioning structure is adapted to move the first antenna to the vertex of the reflector.

6. The measurement arrangement of claim 1, wherein the reflector is a reflector of a compact antenna test range (CATR).

7. The measurement arrangement of claim 1, wherein at least one of the first antenna and the second antenna comprises a horn antenna.

8. The measurement arrangement of claim 1, wherein either the first antenna or the second antenna comprises a wideband antenna.

9. The measurement arrangement of claim 1, wherein a bandwidth of the first antenna is different from a bandwidth of the second antenna.

10. The measurement arrangement of claim 1, further comprising a measurement processor that is coupled to the first antenna and the second antenna, the measurement processor being adapted to perform a first measurement if the second antenna is located at the first position, and to perform a second measurement if the second antenna is located at the second position.

11. The measurement arrangement of claim 1, further comprising a measurement chamber that accommodates the reflector, the radio-frequency lens and the first antenna.

12. The measurement arrangement of claim 11, wherein the measurement chamber comprises an anechoic chamber.

13. A measurement method for measuring radio-frequency signals, the method comprising:
   receiving radio frequency signals by a first antenna and/or emitting radio-frequency signals by the first antenna, wherein the first antenna is arranged outside a vertex of a reflector, the reflector is focusing radio-frequency signals at the vertex, and a radio-frequency lens is arranged between the vertex of the reflector and a phase center of the first antenna, the method further comprising:
   moving a second antenna to the vertex of the reflector and performing a first measurement by the second antenna; and
   moving the second antenna outside the vertex of the reflector and performing a second measurement by the first antenna.

* * * * *